US012757606B2

(12) United States Patent
Kang et al.

(10) Patent No.: US 12,757,606 B2
(45) Date of Patent: Oct. 6, 2026

(54) DISPLAY DEVICE

(71) Applicant: ELECTRONICS AND TELECOMMUNICATIONS RESEARCH INSTITUTE, Daejeon (KR)

(72) Inventors: Chan-mo Kang, Daejeon (KR); Byoung-Hwa Kwon, Daejeon (KR); Gi Heon Kim, Daejeon (KR); Jin-Wook Shin, Daejeon (KR); Nam Sung Cho, Daejeon (KR); Hyunsu Cho, Daejeon (KR); Sukyung Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 516 days.

(21) Appl. No.: 18/315,314

(22) Filed: May 10, 2023

(65) Prior Publication Data

US 2024/0057436 A1 Feb. 15, 2024

(30) Foreign Application Priority Data

Aug. 9, 2022 (KR) ........................ 10-2022-0099514

(51) Int. Cl.
*H10K 59/38* (2023.01)
*H10K 59/35* (2023.01)
*H10K 59/80* (2023.01)

(52) U.S. Cl.
CPC ........... *H10K 59/38* (2023.02); *H10K 59/353* (2023.02); *H10K 59/873* (2023.02); *H10K 59/879* (2023.02)

(58) Field of Classification Search
CPC .. H10K 50/856; H10K 50/844; H10K 50/854; H10K 50/818; H10K 59/35;
(Continued)

(56) References Cited

U.S. PATENT DOCUMENTS 10,243,123 B2 3/2019 Yoo et al.
10,686,019 B2 6/2020 Lee et al.
(Continued)

FOREIGN PATENT DOCUMENTS

KR 10-2014-0091807 A 7/2014
KR 20170024923 A 3/2017
(Continued)

OTHER PUBLICATIONS

Min Chiao Tsai et al., "Tailor Made Mie Scattering Color Filters Made by Size-Tunable Titanium Dioxide Particles", 2012 IF:4.814; ranking: 26/239, J. Phys. Chem. C 2008, 112, 2697-2702, uploaded Sep. 2, 2019, https://www.researchgate.net/publication/335541851.

*Primary Examiner* — Vongsavanh Sengdara
(74) *Attorney, Agent, or Firm* — Rabin & Berdo, P.C.

(57) ABSTRACT

Disclosed is a display device. An embodiment of the inventive concept provides a display device that includes a substrate including a first sub pixel region, a second sub pixel region, and a third sub pixel region, reflective bottom electrodes provided on the substrate, a blue light emitting layer provided on the lower reflective electrodes, an encapsulation layer provided on the blue light emitting layer, a green color conversion layer provided on the encapsulation layer in the first sub pixel region, a color conversion layer provided on the encapsulation layer in the second sub pixel region, a blue reflective layer provided on both the green color conversion layer and the color conversion layer, and a blue transmissive layer disposed adjacent to the color conversion layer and provided on the encapsulation layer in the third sub pixel region.

18 Claims, 5 Drawing Sheets

(58) Field of Classification Search
CPC .. H10K 59/122; H10K 59/873; H10K 59/353; H10K 59/38; H10K 59/879; H10K 2102/331
See application file for complete search history.

(56) References Cited

U.S. PATENT DOCUMENTS

| | | | | |
|---|---|---|---|---|
| 11,271,050 | B2 | 3/2022 | Lee et al. | |
| 11,532,674 | B2 | 12/2022 | Kim et al. | |
| 2013/0341610 | A1 | 12/2013 | Chu et al. | |
| 2016/0168712 | A1 | 6/2016 | Moon et al. | |
| 2019/0131350 | A1* | 5/2019 | Kwak | H10K 59/35 |
| 2020/0328256 | A1* | 10/2020 | Lee | H10K 50/115 |
| 2021/0126056 | A1* | 4/2021 | Kim | H10K 59/122 |
| 2021/0351239 | A1* | 11/2021 | Bae | H10K 59/38 |
| 2022/0328581 | A1* | 10/2022 | Kim | H10K 50/115 |

FOREIGN PATENT DOCUMENTS

| | | | |
|---|---|---|---|
| KR | 10-1945514 | B1 | 2/2019 |
| KR | 10-2019-0058130 | A | 5/2019 |
| KR | 20210052618 | A | 5/2021 |
| KR | 20220070182 | A | 5/2022 |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2022-0099514, filed on Aug. 9, 2022, the entire contents of which are hereby incorporated by reference.

BACKGROUND

The present disclosure herein relates to a display device, and more particularly, to a display device for displaying colors.

With the development of information society, demands for high-performance display devices for displaying information are increasing. For example, the display devices may include liquid crystal displays (LCD), electronic paper (e-paper), organic light emitting displays (OLED), and micro-displays. Among the above display devices, the liquid crystal displays have been in the limelight as the first full-color display devices. The organic light emitting displays have a high response speed and a high contrast ratio, and may achieve a lightweight and thin shape by removing a separate backlight.

SUMMARY

The present disclosure provides a display device capable of enhancing the optical efficiency and resolution.

Disclosed is a display device. An embodiment of the inventive concept provides a display device including: a substrate comprising a first sub pixel region, a second sub pixel region on one side of the first sub pixel region, and a third sub pixel region on the other side of the first sub pixel region; reflective bottom electrodes provided on the substrate; a blue light emitting layer provided on the lower reflective electrodes; an encapsulation layer provided on the blue light emitting layer; a green color conversion layer provided on the encapsulation layer in the first sub pixel region; a color conversion layer provided on the encapsulation layer in the second sub pixel region; a blue reflective layer provided on both the green color conversion layer and the color conversion layer; and a blue transmissive layer disposed adjacent to the color conversion layer and provided on the encapsulation layer in the third sub pixel region.

In an embodiment, the blue transmissive layer may be spiky.

In an embodiment, the blue reflective layer may be flat.

In an embodiment, the blue transmissive layer and the blue reflective layer may have a stacked structure.

In an embodiment, the stacked structure may include: silicon oxide layers; and silicon nitride layers between the silicon oxide layers.

In an embodiment, the display device may further include partition walls which are disposed between the encapsulation layer and the blue reflective layer and provided at boundaries between the first sub pixel region, the second sub pixel region, and the third sub pixel region.

In an embodiment, each of the green color conversion layer and the color conversion layer may be provided between the partition walls.

In an embodiment, the blue transmissive layer may be provided between the partition walls.

In an embodiment, the display device may further include a color filter layer on the blue reflective layer.

In an embodiment, the color filter layer may include: a green color filter on the blue reflective layer in the first sub pixel region; and a red color filter on the blue reflective layer in the second sub pixel region.

In an embodiment, the display device may further include quantum dots inside the color conversion layer and the green color conversion layer.

In an embodiment, the display device may further include nanoparticles which are disposed in the blue transmissive layer and larger than the quantum dots.

In an embodiment, the encapsulation layer may have a first rough surface below the blue transmissive layer.

In an embodiment, the display device may further include a refractive layer provided between the encapsulation layer and the blue transmissive layer.

In an embodiment, the refractive layer may have a second rough surface below the blue transmissive layer.

In an embodiment of the inventive concept, a display device includes: a substrate comprising a first sub pixel region, a second sub pixel region on one side of the first sub pixel region, and a third sub pixel region on the other side of the first sub pixel region; reflective bottom electrodes provided on the substrate; a blue light emitting layer provided on the lower reflective electrodes; an encapsulation layer provided on the blue light emitting layer; partition walls provided on the encapsulation layer and disposed at boundaries between the first to third sub pixel regions; a green color conversion layer provided between the partition walls on the encapsulation layer in the first sub pixel region; a color conversion layer provided between the partition walls on the encapsulation layer in the second sub pixel region; a blue reflective layer having a flat shape and provided on some of the partition walls, the green color conversion layer, and the color conversion layer; and a blue transmissive layer having an uneven shape and provided between the partition walls on the encapsulation layer in the third sub pixel region.

In an embodiment, the display device may further include a color filter layer on the blue reflective layer.

In an embodiment, the color filter layer may include: a green color filter on the blue reflective layer in the first sub pixel region; and a red color filter on the blue reflective layer in the second sub pixel region.

In an embodiment, the display device may further include quantum dots inside the color conversion layer and the green color conversion layer.

In an embodiment, the display device may further include nanoparticles which are disposed in the blue transmissive layer and larger than the quantum dots, wherein the nanoparticles may include titanium oxide nanoparticles.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
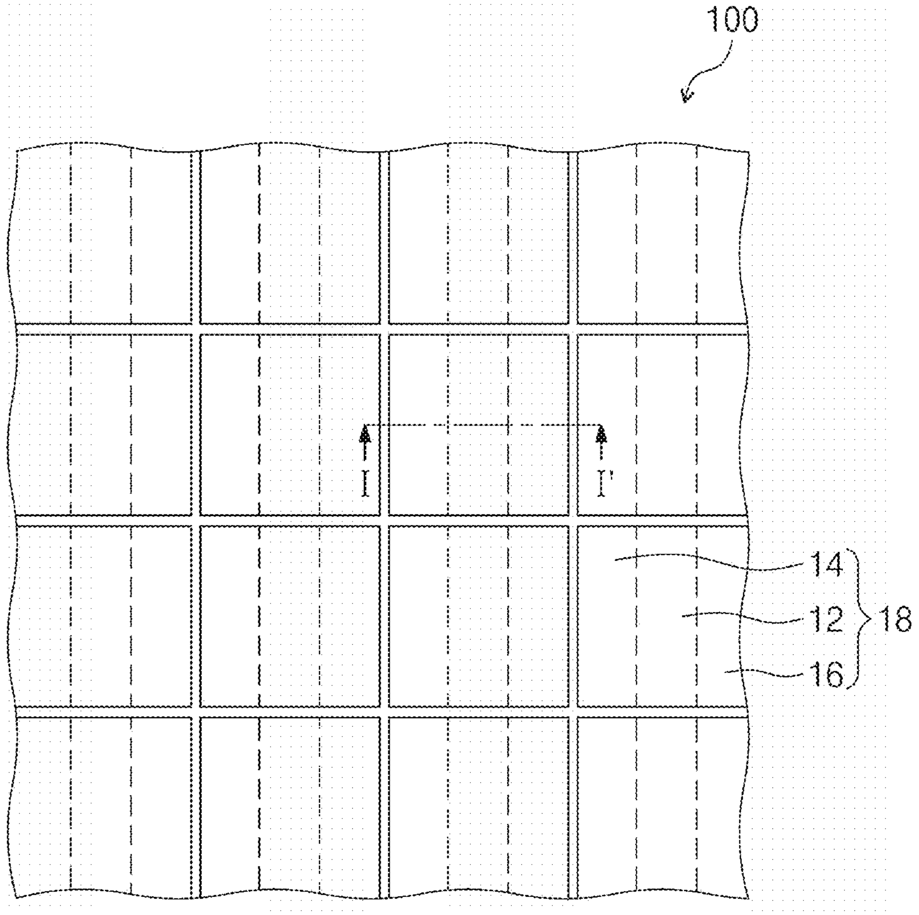
FIG. 1 is a plan view illustrating an example of a display device according to an embodiment of the inventive concept.

Embodiments of the present disclosure are described with reference to the accompanying drawings so as to sufficiently understand configurations and effects of the present disclosure. The present disclosure may, however, be embodied in different forms and diversely modified, and should not be construed as limited to the embodiments set forth herein. Rather, these embodiments are provided so that this disclosure will be thorough and complete, and will fully convey the scope of the present disclosure to a person skilled in the art to which the present disclosure pertains. Those skilled in the art understand that the inventive concept may be practiced in any suitable environment.

The terms used herein are used only for explaining embodiments while not limiting the present disclosure. In this specification, the singular forms include the plural forms as well, unless the context clearly indicates otherwise. The meaning of 'comprises' and/or 'comprising' used herein does not exclude the presence or addition of one or more components, steps, operations, and/or elements other than the mentioned components, steps, operations, and/or elements.

As used herein, when a film (or layer) is referred to as being on another film (or layer) or substrate, it is understood that the film may be formed directly on another film (or layer) or substrate, or intervening elements (or layers) may be arranged therebetween.

Although the terms, such as a first, a second, and the like, are used to describe various regions and films (or layers) in various embodiments described herein, the regions and films are not limited to these terms. These terms are only used to distinguish one region or film (or layer) from another region or film (or layer). Therefore, a layer referred to as a first layer in one embodiment may be referred to as a second layer in another embodiment. Each of embodiments described and exemplified herein also includes a complementary embodiment thereof. Like reference numerals refer to like elements throughout.

Unless otherwise defined, all terms used in embodiments of the inventive concept have the same meaning as commonly understood by one of ordinary skill in the art to which the present disclosure belongs.

Figure 2:
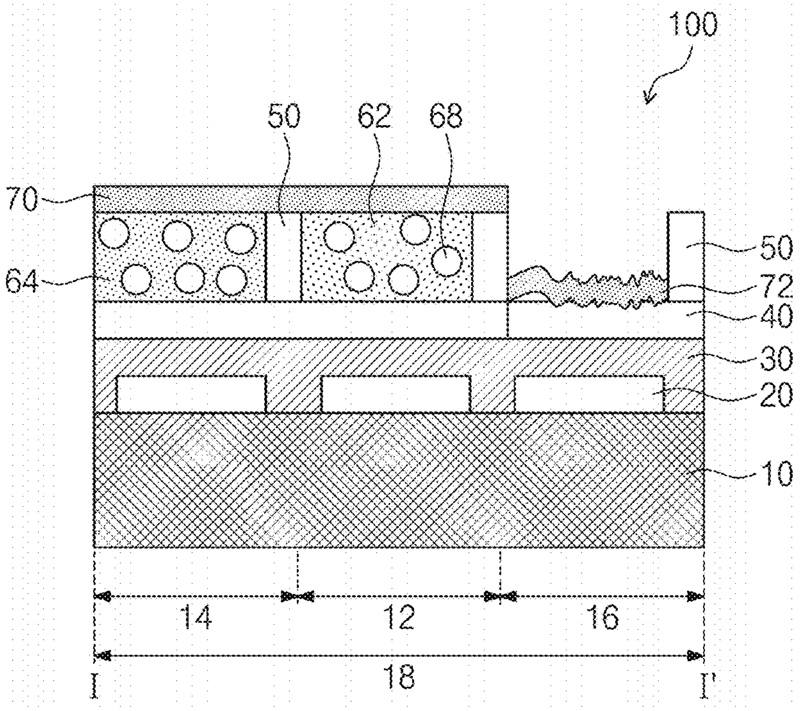
FIG. 2 is a cross-sectional view taken along line I-I' of FIG. 1.

FIG. 1 illustrates an example of a display device 100 according to an embodiment of the inventive concept. FIG. 2 shows a view taken along line I-I' of FIG. 1.

Referring to FIGS. 1 and 2, the display device 100 according to an embodiment of the inventive concept. In an example, the display device 100 according to an embodiment of the inventive concept may include a substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72.

The substrate 10 may include pixel regions 18. The pixel regions 18 may be disposed in a square shape in a plan view. The pixel regions 18 may include a first sub pixel region 12, a second sub pixel region 14, and a third sub pixel region 16. The first sub pixel region 12 may be provided between the second sub pixel region 14 and the third sub pixel region 16. The first sub pixel region 12 may include a green display region. The second sub pixel region 14 may be provided on one side of the first sub pixel region 12. The second sub pixel region 14 may include a red display region. The third sub pixel region 16 may be provided on the other side of the first sub pixel region 12. The third sub pixel region 16 may include a blue display region. The substrate 10 may include a glass substrate or a flexible substrate, but the embodiment of the inventive concept is not limited thereto. Although not illustrated, the substrate 10 may have a driving circuit for driving the blue light emitting layer 30.

The lower electrodes 20 may be individually provided on the substrate in the first sub pixel region 12, the second sub pixel region 14, and the third sub pixel region 16. For example, the lower electrodes 20 may include a single layer of Ag, Al, Mo, Co, W, Cr, Mg, Li, or Ti, or an alloy thereof. On the other hand, the lower electrodes 20 may include transition metal oxide, such as molybdenum oxide (MoOx), vanadium oxide (VOx), tungsten oxide (WOx), nickel oxide (NiOx), and rhenium oxide (ReOx), metal nitride, such as titanium nitride (TiN), transparent conductive oxide, such as indium tin oxide and aluminum doped zinc oxide, conductive polymer, copper iodide, copper thiocyanate, a graphene thin film, and the like. The lower electrodes 20 may be formed by a sputtering process, a thermal deposition process, or a chemical vapor deposition (CVD) process. The lower electrodes 20 may reflect blue light to the blue light emitting layer 30. Also, the lower electrodes 20 may reflect red light and green light.

The blue light emitting layer 30 may be provided on the lower electrodes 20. The blue light emitting layer 30 may generate the blue light. Although not illustrated, the blue light emitting layer 30 may include a hole injection layer, a hole transport layer, an organic light emitting layer, an electron transport layer, an electron injection layer, and an upper electrode.

The hole injection layer may be provided on the lower electrodes 20. For example, the hole injection layer may include at least one of a phthalocyanine compound, DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris(N,N-diphenylamino)triphenylamine), 2-TNATA (4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS ((Polyaniline)/Poly(4-styrenesulfonate)), NPB(N,N'-di (naphthalene-1-yl)-N,N'-diphenyl-benzidine), triphenylamine-containing polyether ketone (TPAPEK), 4-Isopropyl-4'-methyldiphenyliodonium Tetrakis(pentafluorophenyl)borate], or HAT-CN(dipyrazino[2,3-f: 2',3'-h] quinoxaline-2,3,6,7,10,11-hexacarbonitrile). The hole injection layer may have a thickness of, for example, about 1 nm to about 10 nm.

The hole transport layer may be provided on the hole injection layer. The hole transport layer may receive a hole from the hole transport layer and transfer the hole to an organic layer. For example, the hole transport layer may include a carbazole-based derivative, such as N-phenylcarbazole and polyvinylcarbazole, a fluorine-based derivative, a triphenylamine-based derivative, such as TPD(N,N'-bis(3-methylphenyl)-N,N'-diphenyl-[1,1-biphenyl]-4,4'-diamine) and TCTA(4,4',4"-tris(N-carbazolyl)triphenylamine), NPB (N,N'-di(naphthalene-1-yl)-N,N'-diphenyl-benzidine), TAPC(4,4'-Cyclohexylidene bis[N,N-bis(4-methylphenyl) benzenamine]), HMTPD(4,4'-Bis[N,N'-(3-tolyl)amino]-3, 3'-dimethylbiphenyl), or mCP(1,3-Bis(N-carbazolyl)benzene).

The organic light emitting layer may be provided on the hole transport layer. The organic light emitting layer may emit blue light. The organic light emitting layer may include a blue light emitting material. For example, the organic light emitting layer may include one of oxadiazole dimer dyes (Bis-DAPOXP)), spiro compounds (Spiro-DPVBi, Spiro-6P), triarylamine compounds, bis(styryl)amine (DPVBi, DSA), 4,4'-bis(9-ethyl-3-carbazovinylene)-1,1'-biphenyl (BCzVBi), perylene, 2,5,8,11-tetra-tert-butyl perylene (TPBe), 9H-carbazole-3,3'-(1,4-phenylene-di-2,1-ethen-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), and bis(3,5-difluoro-2-(2-pyridyl)phenyl-(2-carboxypyridyl)iridium III (FIrPic). Also, the organic light emitting layer may include a polymer light emitting material, such as polyfluorene-based polymer and polyvinyl-based polymer. In addition, the organic light emitting layer may include quantum dots.

The electron transport layer may be provided on the organic light emitting layer. For example, the electron transport layer may include one of Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebg2(berylliumbis(benzoquinolin-10-olate)), and ADN(9,10-di(naphthalene-2-yl)anthracene).

The electron injection layer may be provided on the electron transport layer. For example, the electron injection layer may include one of a lanthanide metal, such as LiF, LiQ (Lithium quinolate), $Li_2O$, BaO, NaCl, CsF, and Yb, a halide metal, such as RbCl and RbI, and a material in which an electron transport material and organo metal salt having an insulating property are mixed.

The upper electrode may be provided on the electron injection layer. For example, the upper electrode may include one of Ag, Al, Au, Mo, Co, W, Cr, Mg, Li, Ti, indium zinc oxide (IZO), indium tin oxide (ITO), indium gallium oxide (IGO), indium zinc gallium oxide (IGZO), conductive polymer, graphene, and a mixture/compound thereof.

Figure 8:
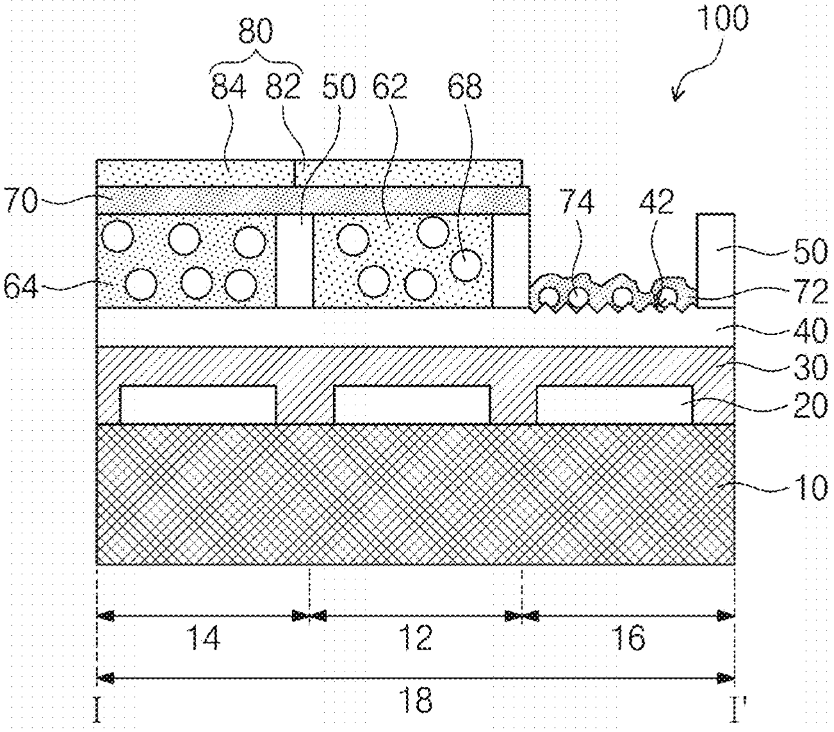
FIG. 8 is a cross-sectional view showing an example of a display device according to an embodiment of the inventive concept.

Referring back to FIG. 2, the encapsulation layer 40 may be provided on the blue light emitting layer 30. The encapsulation layer 40 may protect the blue light emitting layer 30. For example, the encapsulation layer 40 may have a single- or multi-layer structure of inorganic thin films, such as silicon oxide (SiOx), silicon nitride (SiNx), silicon oxynitride (SiOxNy), aluminum oxide (AlOx), and hafnium oxide (HfOx), organic thin films, such as polyvinyl chloride resin, vinyl acetate resin, polystyrene resin, polyamide resin, polyimide resin, methacrylic resin, melamine resin, polyurethane resin, polyethylene resin, ethylene vinyl copolymer resin, polypropylene resin, polyester resin, acrylic resin, nylon, polycarbonate resin, and cellulose, and organic-inorganic composite thin films, such as Hexamethyldisiloxane, polysilazane, polysiloxane, and polysilsesquioxane. According to an example, the encapsulation layer 40 selectively may have an uneven upper surface in the third sub pixel region 16. For example, the encapsulation layer 40 may have a first rough surface 42 (FIG. 8).

The partition walls 50 may be provided at boundaries between the first sub pixel region 12, the second sub pixel region 14, and the third sub pixel region 16. The partition walls 50 may reflect and/or absorb the blue light. For example, the partition walls 50 may include metal or polymer. On the other hand, the partition walls 50 may include an opaque dielectric material, but the embodiment of the inventive concept is not limited thereto.

The green light conversion layer 62 may be provided on the encapsulation layer 40 in the first sub pixel region 12. The green light conversion layer 62 may be provided between the partition walls 50. The green light conversion layer 62 may absorb the blue light of the blue light emitting layer 30 and generate the green light.

The red light conversion layer 64 may be provided between the partition walls 50 on the encapsulation layer 40 in the second sub pixel region 14. The red light conversion layer 64 may absorb the blue light and generate the red light.

The green light conversion layer 62 and the red light conversion layer 64 may have quantum dots 68. The quantum dots 68 may include one of a group II-VI compound, a group III-V compound, a group IV-VI compound, a group IV element, a group IV compound, and a combination thereof. For example, the group II-VI compound may include one of: a binary element compound selected from the group consisting of CdSe, CdTe, ZnS, ZnSe, ZnTe, ZnO, HgS, HgSe, HgTe, MgSe, MgS, and a mixture thereof; a ternary element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group III-V compound may include one of: a binary element compound selected from the group consisting of GaN, GaP, GaAs, GaSb, AlN, AlP, AlAs, AlSb, InN, InP, InAs, InSb, and a mixture thereof; a ternary element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may include one of: a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof. The group IV element may include one of Si, Ge, and a mixture thereof, and the group IV compound may include one of SiC, SiGe, and a mixture thereof.

The blue reflective layer 70 may be provided on some of the partition walls 50, the green light conversion layer 62, and the red light conversion layer 64. In an example, the blue reflective layer 70 may be flat. The blue reflective layer 70 may reflect the blue light to the green light conversion layer 62 and the red light conversion layer 64. In an example, the blue reflective layer 70 may include a dielectric, semiconductor, or stacked structure of metals. The stacked structure of the blue reflective layer 70 may include a plurality of material layers which have different refractive indexes and alternately disposed in a vertical view. For example, the stacked structure of the blue reflective layer 70 may include silicon compound layers and metal layers between the silicon compound layers. The stacked structure of the blue reflective layer 70 may include dielectric layers of $HfO_2$, $TiO_2$, LiF, or $MoO_3$. On the other hand, the stacked structure of the blue reflective layer 70 may include silicon nitride layers and silicon oxide layers between the silicon nitride layers, but the embodiment of the inventive concept is not limited thereto.

The blue transmissive layer 72 may be selectively provided on the encapsulation layer 40 in the third sub pixel region 16. The blue transmissive layer 72 may be not flat. The blue transmissive layer 72 may be spiky. The blue transmissive layer 72 may have the same material as the blue reflective layer 70. In an example, the blue transmissive layer 72 may include a dielectric, semiconductor, or stacked structure of metals. For example, the blue transmissive layer 72 may include silicon compound layers and metal layers between the silicon compound layers. In addition, the blue transmissive layer 72 may include silicon nitride layers and silicon oxide layers between the silicon nitride layers, but the embodiment of the inventive concept is not limited thereto. The blue transmissive layer 72 may lose blue reflection characteristics due to a change in Bragg wavelength according to a critical angle or incident angle. The blue transmissive layer 72 may allow the blue light to pass therethrough.

Figure 3:
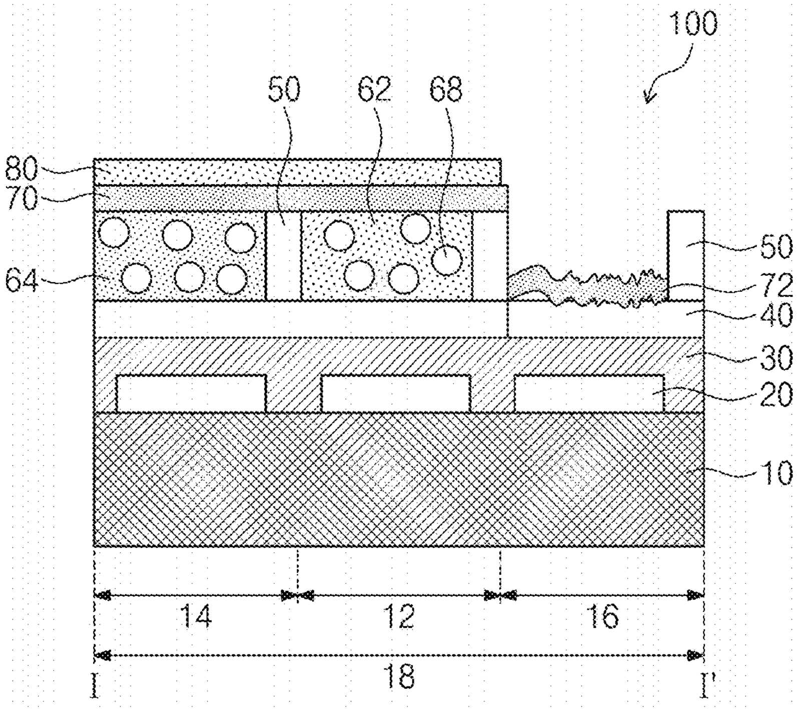
FIG. 3 is a cross-sectional view showing an example of a display device according to an embodiment of the inventive concept.

FIG. 3 illustrates an example of a display device 100 according to an embodiment of the inventive concept.

Referring to FIG. 3, the display device 100 according to an embodiment of the inventive concept may further include a color filter layer 80. The color filter layer 80 may be provided on a blue reflective layer 70. The color filter layer 80 may include a yellow color filter layer. The color filter layer 80 may filter the green light and the red light or convert same into yellow light.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

Figure 4:
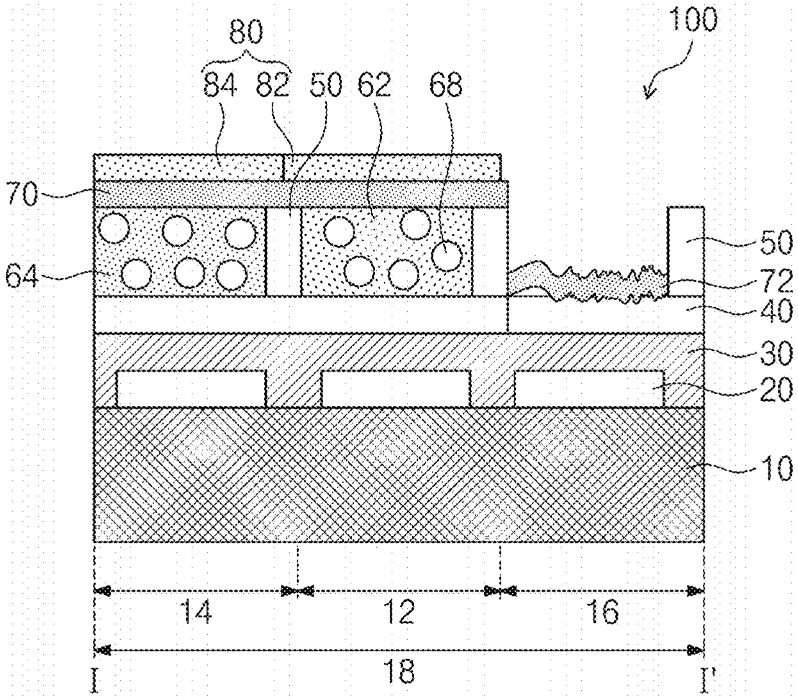
FIG. 4 is a cross-sectional view showing an example of a display device according to an embodiment of the inventive concept.

FIG. 4 illustrates an example of a display device 100 according to an embodiment of the inventive concept.

Referring to FIG. 4, a color filter layer 80 of the display device 100 according to an embodiment of the inventive concept may include a green color filter 82 and a red color filter 84. The green color filter 82 may be provided on a blue reflective layer 70 in a first sub pixel region 12. The green color filter 82 may block the blue light and allow the green light to pass therethrough. The red color filter 84 may be provided on a blue reflective layer 70 in a second sub pixel region 14. The red color filter 84 may block the blue light and allow the red light to pass therethrough.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

Figure 5:
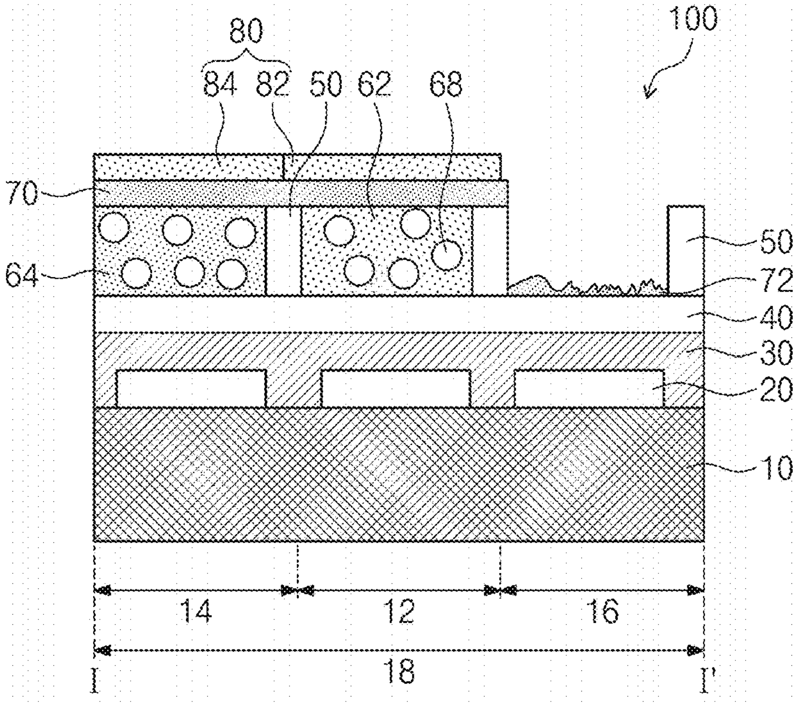
FIG. 5 is a cross-sectional view showing an example of a display device according to an embodiment of the inventive concept.

FIG. 5 illustrates an example of a display device 100 according to an embodiment of the inventive concept.

Referring to FIG. 5, a blue transmissive layer 72 may be thinner than a blue reflective layer 70 in the display device 100 according to an embodiment of the inventive concept. A portion of the blue transmissive layer 72 may be removed by a texturing process or an etching process. The blue transmissive layer 72 may allow the blue light to pass therethrough. On the other hand, the blue transmissive layer 72 may be removed from an encapsulation layer 40 in a third sub pixel region 16. The encapsulation layer 40 in the third sub pixel region 16 may be exposed.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

Figure 6:
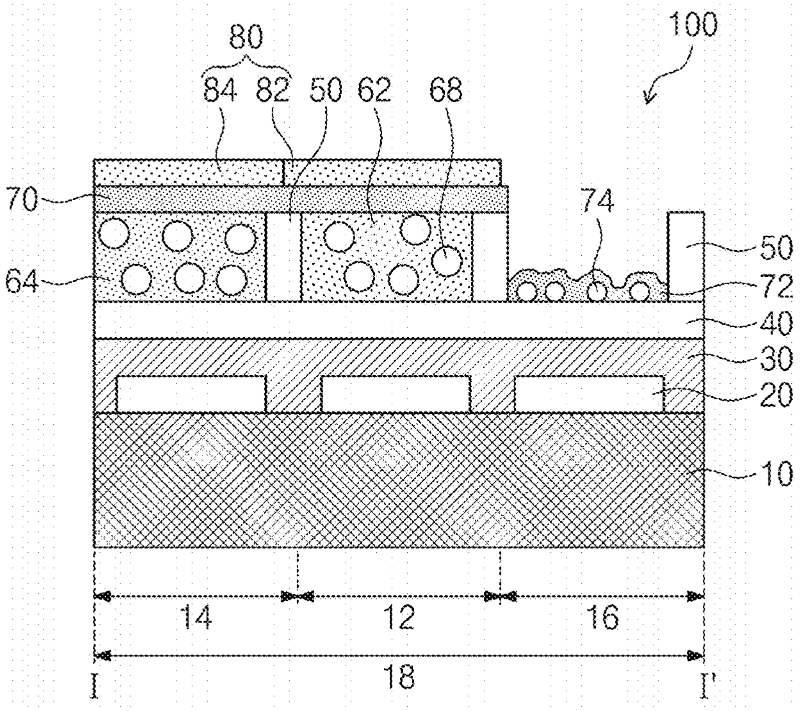
FIG. 6 is a cross-sectional view showing an example of a display device according to an embodiment of the inventive concept.

FIG. 6 illustrates an example of a display device 100 according to an embodiment of the inventive concept.

Referring to FIG. 6, a blue transmissive layer 72 of the display device 100 according to an embodiment of the inventive concept may have nanoparticles 74. The nanoparticles 74 may be larger than quantum dots 68. The nanoparticles 74 may increase the surface roughness of the blue transmissive layer 72 and increase the transmittance of blue light. The nanoparticles 74 may include transparent nanoparticles. For example, the nanoparticles 74 may include titanium oxide nanoparticles.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

Figure 7:
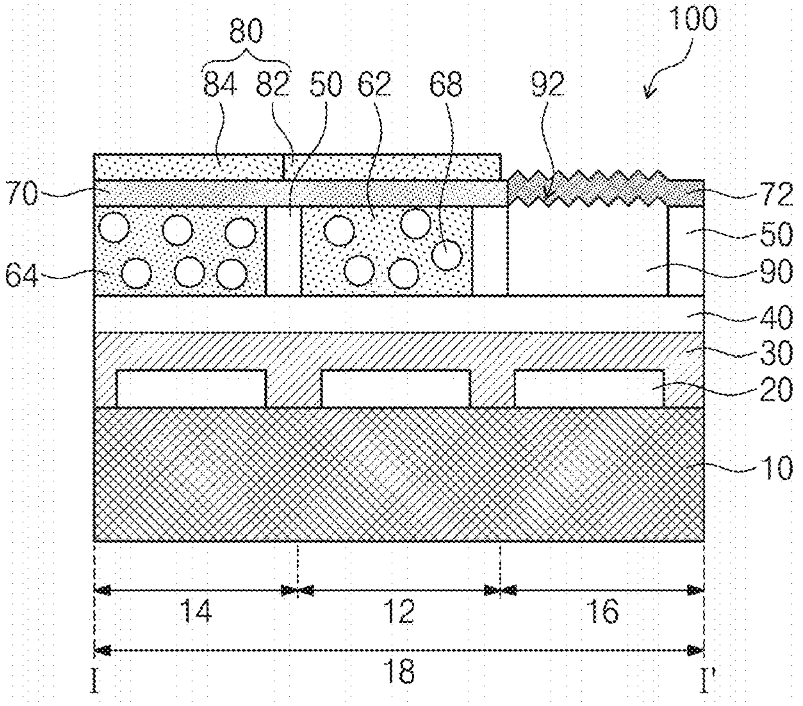
FIG. 7 is a cross-sectional view showing an example of a display device according to an embodiment of the inventive concept.

FIG. 7 illustrates an example of a display device 100 according to an embodiment of the inventive concept.

Referring to FIG. 7, the display device 100 according to an embodiment of the inventive concept may further include a refractive layer 90. The refractive layer 90 may be provided between an encapsulation layer 40 and a blue transmissive layer 72 in a third sub pixel region 16. The refractive layer 90 may be provided between partition walls 50. The refractive layer 90 may allow the blue light to pass therethrough. The refractive layer 90 may have a thickness similar to those of a green light conversion layer 62 and a red light conversion layer 64. The refractive layer 90 may have a second rough surface 92. The second rough surface 92 may increase the surface roughness of the blue transmissive layer 72 and increase the transmittance of blue light.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

FIG. 8 illustrates an example of a display device 100 according to an embodiment of the inventive concept.

Referring to FIG. 8, a blue transmissive layer 72 of the display device 100 according to an embodiment of the inventive concept may have nanoparticles 74, and an encapsulation layer 40 may include a first rough surface 42. The nanoparticles 74 and the first rough surface 42 may increase the surface roughness of the blue transmissive layer 72 and increase the transmittance of blue light.

A substrate 10, lower electrodes 20, a blue light emitting layer 30, an encapsulation layer 40, partition walls 50, a green light conversion layer 62, a red light conversion layer 64, a blue reflective layer 70, and a blue transmissive layer 72 may be configured in the same manner as those shown in FIG. 2.

The display device according to the embodiments of the inventive concept may enhance the optical efficiency and resolution by using the blue transmissive layer that has the same material as the blue reflective layer on both the green light conversion layer and the red light conversion layer.

Those skilled in the art to which the present disclosure pertains will understand that the present disclosure can be carried out in other specific forms without changing the technical idea or essential features. Therefore, the above-described embodiments are to be considered illustrative and not restrictive to all aspects.

What is claimed is:

1. A display device comprising:

a substrate comprising a first sub pixel region, a second sub pixel region on one side of the first sub pixel region, and a third sub pixel region on the other side of the first sub pixel region;

reflective bottom electrodes provided on the substrate;

a blue light emitting layer provided on the reflective bottom electrodes;

an encapsulation layer provided on the blue light emitting layer;

a green color conversion layer provided on the encapsulation layer in the first sub pixel region;

a color conversion layer provided on the encapsulation layer in the second sub pixel region;

a blue reflective layer provided on both the green color conversion layer and the color conversion layer; and a blue transmissive layer disposed adjacent to the color conversion layer and provided on the encapsulation layer in the third sub pixel region;

wherein the blue transmissive layer is spiky; and wherein the encapsulation layer has a rough surface below the blue transmissive layer and a flat surface below the green color conversion layer and the color conversion layer.

2. The display device of claim 1, wherein the blue reflective layer is flat.

3. The display device of claim 1, wherein the blue transmissive layer and the blue reflective layer have a stacked structure.

4. The display device of claim 3, wherein the stacked structure comprises:

silicon oxide layers; and silicon nitride layers between the silicon oxide layers.

5. The display device of claim 1, further comprising partition walls which are disposed between the encapsulation layer and the blue reflective layer and provided at boundaries between the first sub pixel region, the second sub pixel region, and the third sub pixel region.

6. The display device of claim 5, wherein each of the green color conversion layer and the color conversion layer is provided between the partition walls.

7. The display device of claim 5, wherein the blue transmissive layer is provided between the partition walls.

8. The display device of claim 1, further comprising a color filter layer on the blue reflective layer.

9. The display device of claim 8, wherein the color filter layer comprises:

a green color filter on the blue reflective layer in the first sub pixel region; and a red color filter on the blue reflective layer in the second sub pixel region.

10. The display device of claim 1, further comprising quantum dots inside the color conversion layer and the green color conversion layer.

11. The display device of claim 10, further comprising nanoparticles which are disposed in the blue transmissive layer and larger than the quantum dots.

12. The display device of claim 10, further comprising a refractive layer provided between the encapsulation layer and the blue transmissive layer.

13. The display device of claim 12, wherein the refractive layer has a second rough surface below the blue transmissive layer.

14. A display device comprising:

a substrate comprising a first sub pixel region, a second sub pixel region on one side of the first sub pixel region, and a third sub pixel region on the other side of the first sub pixel region;

reflective bottom electrodes provided on the substrate;

a blue light emitting layer provided on the reflective bottom electrodes;

an encapsulation layer provided on the blue light emitting layer;

partition walls provided on the encapsulation layer and disposed in boundaries of the first to third sub pixel regions;

a green color conversion layer provided between the partition walls on the encapsulation layer in the first sub pixel region;

a color conversion layer provided between the partition walls on the encapsulation layer in the second sub pixel region;

a blue reflective layer having a flat shape and provided on some of the partition walls, the green color conversion layer, and the color conversion layer; and a blue transmissive layer having an uneven shape and provided between the partition walls on the encapsulation layer in the third sub pixel region;

wherein the blue transmissive layer is spiky; and wherein the encapsulation layer has a rough surface below the blue transmissive layer and a flat surface below the green color conversion layer and the color conversion layer.

15. The display device of claim 14, further comprising a color filter layer on the blue reflective layer.

16. The display device of claim 15, wherein the color filter layer comprises:

a green color filter on the blue reflective layer in the first sub pixel region; and a red color filter on the blue reflective layer in the second sub pixel region.

17. The display device of claim 14, further comprising quantum dots inside the color conversion layer and the green color conversion layer.

18. The display device of claim 14, further comprising nanoparticles which are disposed in the blue transmissive layer and smaller than the quantum dots, wherein the nanoparticles comprise titanium oxide particles.

* * * * *